(12) United States Patent
Wasserbauer et al.

(10) Patent No.: US 6,751,245 B1
(45) Date of Patent: Jun. 15, 2004

(54) SINGLE MODE VERTICAL CAVITY SURFACE EMITTING LASER

(75) Inventors: John G. Wasserbauer, Erie, CO (US); Jeffrey W. Scott, Boulder, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 194 days.

(21) Appl. No.: 09/587,074

(22) Filed: Jun. 2, 2000

Related U.S. Application Data

(60) Provisional application No. 60/137,093, filed on Jun. 2, 1999.

(51) Int. Cl.$^7$ ................................................. H01S 5/00
(52) U.S. Cl. ........................ 372/46; 372/45; 372/372; 372/96
(58) Field of Search ........................... 372/46, 45, 96

(56) References Cited

U.S. PATENT DOCUMENTS

| | | | |
|---|---|---|---|
| 5,245,622 A | 9/1993 | Jewell et al. | 372/45 |
| 5,317,587 A | 5/1994 | Ackley et al. | 372/45 |
| 5,574,738 A | 11/1996 | Morgan | 372/28 |
| 5,753,941 A | 5/1998 | Shin et al. | 257/98 |
| 5,838,715 A | 11/1998 | Corzine et al. | 372/96 |
| 5,867,516 A | 2/1999 | Corzine et al. | 372/45 |
| 5,879,961 A | 3/1999 | Scott | 438/32 |
| 5,940,422 A | 8/1999 | Johnson | 372/45 |

OTHER PUBLICATIONS

Scott, "Design, Fabrication and Characterization of High–Speed Intra–Cavity Contacted Vertical–Cavity Lasers," UC Santa Barbara, ECE Technical Report #95–06, Jun. 1995, 280 pages.

Knopp, "Vertical–Cavity Surface–Emitting Lasers: Tailoring of Optical Admittances," Thesis, 1999, 264 pages. (no month).

*Primary Examiner*—Quyen Leung
(74) *Attorney, Agent, or Firm*—Barlow, Josephs & Holmes, Ltd.

(57) ABSTRACT

A surface emitting laser with spatially varying optical loss to provide single mode operation. The optical loss may be introduced with an anti-phased ohmic contacts. Current injection may be constricted to a diameter that is different than the diameter of the ohmic aperture, allowing for optimization of carrier profiles for high-speed performance. Methods for index guiding are introduced to further the reproducibility of the invention.

31 Claims, 13 Drawing Sheets

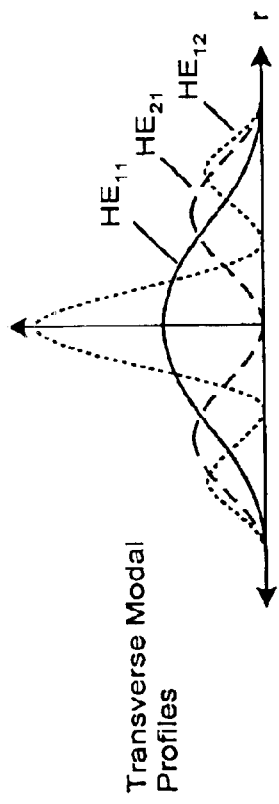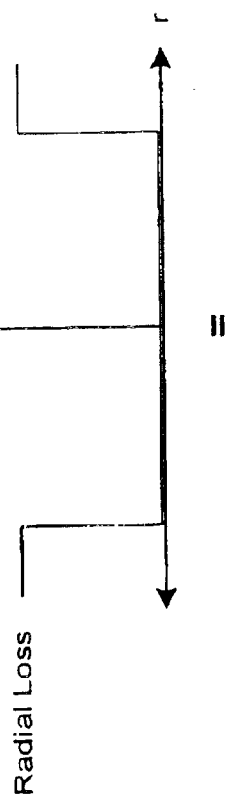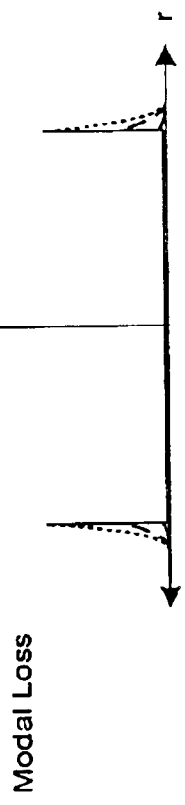

SINGLE MODE VERTICAL CAVITY SURFACE EMITTING LASER

CROSS REFERENCE TO RELATED APPLICATION

The present application claims priority to provisional Application No. 60/137,093 filed Jun. 2, 1999, entitled ESX MODE CONTROL FOR SURFACE EMITTING LASER.

BACKGROUND

Over the past decade, the demand for increased speed (gigabit communications) has forced the data communications infrastructure to evolve beyond the limits of traditional copper based transmission media to the higher bandwidth achievable with fiber optics. The emergence of these high bandwidth communication systems has created a need for standards-based optical transceiver components. While edge-emitting lasers remain the dominant technique for long-wavelength Fabry-Perot type transceivers, vertical cavity surface emitting laser (VCSEL) technology has become more cost effective for manufacturing short-wavelength transceivers and are emerging for long wavelength applications. In addition single mode lasers have advantages in terms of high speed data transmission due to the well define rise and fall time of the single optical mode. When simulating emissions from lasers with multiple modes complex interactions between the modes and the carrier lead to non-deterministic results that are typified in digital systems as jitter. Reducing jitter is one of the challenges to increasing data rates from single Gigabit/sec rates to tens of Gigabits/sec and above. Another advantage of single mode lasers is the pure spectral content, beam shape and high coherency which is desirable for sensor application such as for example, laser scanners, interferometers, position sensors and medical spectroscopic sensors.

A principal characteristic of a VCSEL is that it emits beams vertically, i.e. in a direction normal to the p-junction of the semiconductor wafer from which it was fabricated. Historically, VCSELs have been fabricated using crystalline growth techniques to deposit many layers of semiconductor material upon a substrate. These lasers include highly reflective surfaces above and below an active layer, forming a short laser cavity perpendicular to the active layer plane. This enables laser output normal to the surface of the device instead of horizontally, as with edge-emitting lasers. Vertical cavity devices thus take up less space and require less power to drive the lasing action.

VCSELs generate light by a laser current flowing through a relatively large cross-sectional area of semiconductor material in a light-generating region. When the laser current is just above the threshold level, a VCSEL operates in a single transverse -mode. However, when the laser current is increased beyond a second, higher, threshold level, the laser begins to emit a light beam with a multi-mode distribution. Known VCSELs typically use a short optical cavity which inherently limits operation to a single longitudinal (or axial) mode. However, VCSELs are typically on the order of about three microns versus twenty microns across so that lateral (or transverse) modes tend to become multi-mode due to the large transverse dimensions relative to the lasing wavelength. VCSELs sized to ensure single-mode operation suffer from increased thermal impedance and electrical resistance which restricts the VCSEL's range of operation.

Many approaches for controlling the transverse mode structure have been developed in recent years. One approach controls the current injection profile to match the desired mode. For example, U.S. Pat. No. 5,245,622 (hereinafter known as the '622 patent) which issued to Jewell et al on Sep. 14, 1993, describes a vertical cavity surface emitting laser with intra-cavity structures. The intra-cavity structures allow the vertical cavity surface emitting laser to achieve low series resistance, high power efficiencies and $TEM_{00}$ mode radiation. In one embodiment of the invention, a VCSEL comprises a laser cavity disposed between an upper and a lower mirror. The laser cavity comprises upper and lower spacer layers sandwiching an active region. A stratified electrode for conducting electrical current to the active region is disposed between the upper mirror and the upper spacer. The stratified electrode comprises a plurality of alternating high and low doped layers for achieving low series resistance without increasing the optical absorption.

The VCSEL disclosed in the '622 patent further comprises a disc shaped current aperture formed in the stratified electrode by reducing the conductivity of an annular region of material surrounding the current aperture. The current aperture suppresses radiation of higher mode. In another embodiment, a metal contact layer having an optical aperture is formed within the upper mirror of the VCSEL. The optical aperture blocks the optical field in such a manner that introduces lasing of higher order transverse modes. The content of the '622 patent is hereby incorporated by reference as if set forth in fill.

Alternative approaches to single mode laser operation spatially modulate the optical loss so as to increase the threshold of selected modes. The principle of spatial mode control is shown below in FIG. 1. The optical loss, given by L=1−R where R is the reflectivity as seen from the laser cavity, is modulated spatially. The overlap integral of the intensity profile $I_m(r)$ with the optical loss L(r) makes the modal loss $L_m$ as given in Equation 1. By making the modal loss significantly higher for the undesired modal profiles, those modes may be selected to be suppressed by design.

$$L_m = \int \int I_{m(r)} L(r) r \, dr \, d\theta \quad (1)$$

An example of spatial mode control is disclosed in U.S. Pat. No. 5,940,422 (hereinafter known as the '422 patent) which issued to Johnson et al on Aug. 17, 1999. The '422 patent discloses a vertical cavity surface emitting laser having a mode control structure that selectively encourages or inhibits the lasing of the laser in regions of the mode control structure. The mode control structure is a patterned dielectric coating on the lasers surface which is stepped from an optical thickness of ½ $\lambda_s$ (where $\lambda_s$ is the wavelength in the material) in the regions where lasing is desired to ¼ $\lambda_s$ in regions where lasing is not desired. The content of the '422 patent is hereby incorporated by reference as if set forth in full.

A further example of spatial mode control is disclosed in U.S. Pat. No. 5,753,941 (hereinafter known as the '941 patent) which issued to Shin et al on May 19, 1998. The Shin patent discloses a vertical cavity surface emitting laser with an electrode layer comprising a metal layer having a high electrical conductivity and a conductive auxiliary reflector layer formed between the metal layer and the VCSEL semiconductor mirrors. The auxiliary reflector layer is formed of nickel, molybdenum, platinum or chromium. The reflectivity of the auxiliary reflector layer is approximately 98–99%, which is lower than the reflectivity of the semiconductor mirrors. Therefore, the intensity of the light reflected from the lower surface of a protruding portion of the auxiliary reflector layer is less than the intensity of the light reflected from the surface without the metal. Thus, the auxiliary reflector layer suppresses the emission of light of higher order modes and thus serves to emit low-noise light of a single mode via the cavity. The content of the '941 patent is hereby incorporated by reference as if set forth in full.

An additional example of spatial mode control is disclosed in a PhD thesis entitled "Vertical-Cavity Surface-Emitting Lasers: Tailoring of Optical Admittances," by Kevin J. Knopp, University of Colorado at Boulder, 1999 (hereinafter the Knopp reference) which describes the use of an anti-phase metal on the surface of the upper semiconductor mirror to introduce spatially selective loss. The loss is increased at the periphery of the laser, thereby effecting the higher order modes and preferentially selecting the fundamental mode. Equations for the reflectivity of the semiconductor mirrors with either air or metal terminations are presented and convoluted with the modal intensity profiles to provide estimates of the modal loss discrimination. The Knopp reference is hereby explicitly incorporated by reference.

However, conventional methods for controlling the operating mode of a laser are either complicated to manufacture or utilize only one of the two major approaches to mode control. Some provide for discrimination between the threshold of different modes by introducing spatially varying losses while others adjust the current injection to match the spatial profile of the desired modes. For example, the '622 patent requires a relatively complicated fabrication sequence and only addresses spatial matching of the current to the fundamental mode. Similarly, the '422 patent teaches the use of optical loss modulation via anti-phased dielectrics but does not teach or suggest the benefits of spatial current modulation. Therefore, the non-lasing regions will be electrically pumped but will not lase, leading to higher overall threshold currents and slower optical rise and fall times as carriers from the non-lasing regions of the active layer diffuse into the lasing regions. Similarly, the '941 patent integrates a low reflectance metal under the ohmic contacts to realize spatially varying losses. However, the low reflectance metal may make the device resistance difficult to control. In addition, the '941 patent does not utilize spatial current modulation.

The Knopp reference suggests a single mode laser design using anti-phased gold, silver or aluminum metal annulus. However, the anti-phase resonance achieved by the Knopp technique has a very narrow spectral band, making the manufacturing difficult. In addition, no method of transverse index guiding to control the lateral profile of the modes is taught. Further, no spatial current modulation, or current constriction is taught or discussed.

Therefore, it would be advantageous to provide a system and a robust method of providing spatial variation in current and optical loss that may be readily implemented, to provide a highly manufacturable single-mode VCSEL.

BRIEF DESCRIPTION OF THE DRAWINGS

These and other features, aspects, and advantages of the present invention will become better understood with regard to the following description, appended claims, and accompanying drawings where:

FIG. 1a is a graphical depiction of the transverse modal profile of the $HE_{11}$, $HE_{21}$, and $HE_{12}$ modes as a function of location on the VCSEL surface;

FIG. 1b is a graphical depiction of the radial optical loss of an exemplary embodiment of the present invention;

FIG. 1c is a graphical depiction of the radial modal loss of an exemplary embodiment of the present invention;

SUMMARY OF THE INVENTION

There is therefore provided in a presently preferred embodiment of the present invention a VCSEL which emits in a single mode having a semiconductor anti-phase ohmic contact in the midst of a hybrid semiconductor-dielectric mirror wherein the anti-phased ohmic contact provide selective modal loss suppress high order modes. In another aspect an exemplary VCSEL further includes a lateral index guide for controlling modal overlap with the optical loss. In another aspect of the present invention an exemplary VCSEL further includes a current constriction aperture that inhibits current injection into the non-lasing material under the ohmic contact.

In another aspect of the present invention a method for fabricating a VCSEL that emits in a single mode includes depositing a first semiconductor mirror layer on a substrate, depositing an active layer on the first semiconductor mirror layer, depositing a second semiconductor mirror layer on the active layer, forming a semiconductor anti-phase layer on the second semiconductor mirror layer, forming an ohmic contact on the semiconductor anti-phase layer wherein said ohmic contact and anti-phase layer provide mode selective optical loss to suppress high order transverse modes.

In yet another aspect of the present invention a method for fabricating VCSEL that emits in a single mode includes forming a first mirror on a substrate, forming an active layer on the first mirror layer, forming a second mirror on the active layer, forming a dielectric spacer layer on the second mirror layer, forming a dielectric mirror on the dielectric spacer layer; and varying the phase of the dielectric spacer layer to form a lateral index guide, thereby suppressing higher order modes.

DETAILED DESCRIPTION OF THE INVENTION

An exemplary embodiment of the present invention, introduces a spatially-varying optical loss to ensure single-mode operation while a method for index guiding is introduced to ensure consistency of the transverse mode profiles. In addition, current injection may be constricted to optimize carrier profiles for high-speed performance. Utilizing a hybrid semiconductor-dielectric mirror enables the implementation in a manufacturable and robust manner.

Figure 2:
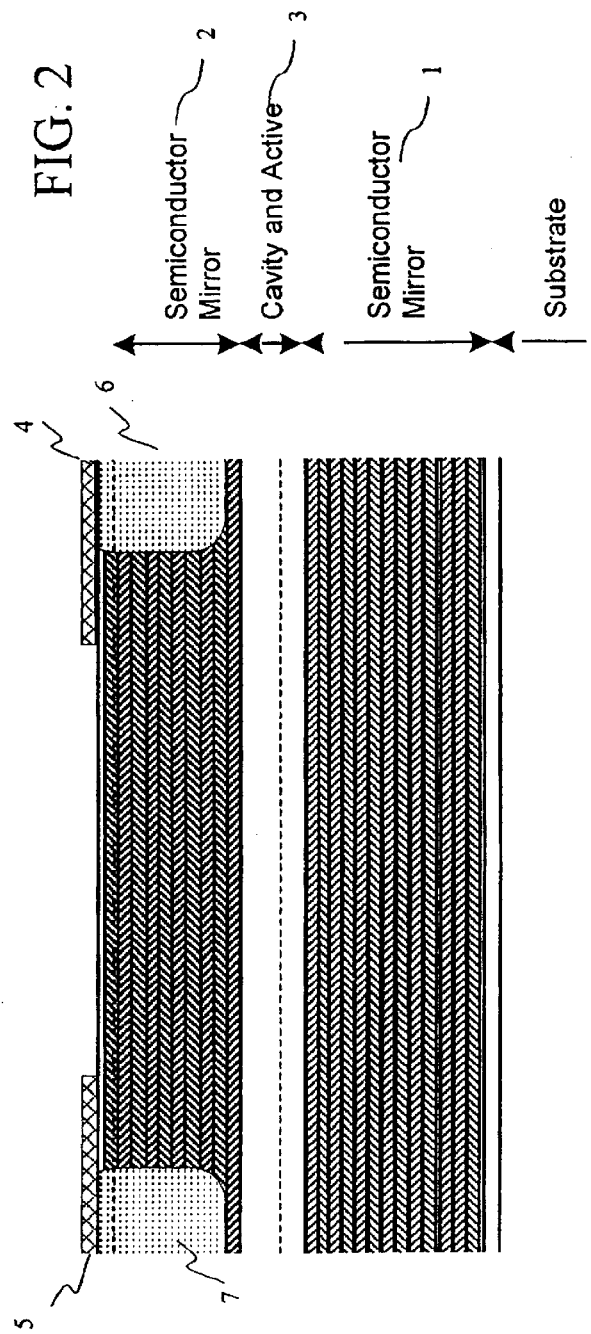
FIG. 2 is a cross-sectional view of a conventional VCSEL structure.

Referring to FIG. 2 a conventional VCSEL portion of an exemplary embodiment of the present invent is disclosed in U.S. Pat. No. 6,160,834, the contents of which are hereby incorporated by reference. Known VCSEL designs include a substrate (not shown), a first semiconductor mirror layer 1, an optical cavity 3 and a second or upper mirror 2. As is commonly known in the art, the substrate may be made of gallium arsenide (GaAs) or any other suitable material. The upper and lower mirrors 1, 2 in accordance with a preferred embodiment of the present invention may comprise multi-layered distributed Bragg reflectors, (DBRs) as is i conventional in the art. In an exemplary embodiment, aluminum gallium arsenide (AlGaAs) and aluminum arsenide (AlAs), with varying concentrations of aluminum and gallium are used to fabricate N-type and P-type mirrors 1, 2 respectively. The optical thickness of each mirror layer is typically designed to be a quarter wavelength of the emitted light of the laser where the optical thickness is given by the product of the physical thickness and the index of refraction.

Figure 3:
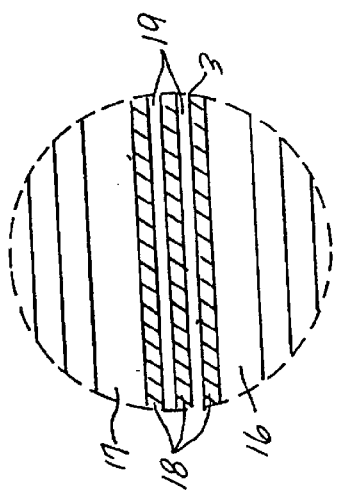
FIG. 3 is a cross-sectional view of a conventional optical cavity having a plurality of quantum wells.

Referring to FIG. 3, an optical cavity in accordance with an exemplary embodiment of the present invention may include an active region 3 surrounded by first and second cladding regions 16, 17. The first and second cladding regions 16, 17 are preferably made of AlGaAs in an exemplary embodiment. In the active region 3, three quantum wells 18 made of GaAs are preferably disposed adjacent barrier layers 19 made of $Al_{0.25}Ga_{0.75}As$. As is generally understood in the art, the number of and materials forming the quantum wells 18 and surrounding barrier layers 19 can be varied depending on the design. Therefore, the disclosed optical cavity is by way of example and not by way of limitation.

Referring again to FIG. 2, the preferred VCSEL structure may be formed into discrete lasers by a combination of current confinement and ohmic contacts. Current constriction is preferably achieved by implanting Hydrogen ions at multiple energies as is known in the art. Implantation regions 6, 7 convert the upper mirror 2 to high resistivity. The encircling high resistance region forms a funnel to provide current confinement as is known in the art. Other techniques for current constriction, such as selective AlAs oxidation, are also applicable.

A top ohmic contact is disposed on the surface with an aperture inside the proton blocking aperture. The bottom of the substrate 14 preferably includes a contact metalization, forming a n-ohmic contact 20. The n-ohmic contact may be, for example, eutectic gold germanium. deposited by electron beam evaporation or sputtering. The top p-ohmic contacts 4, 5 have an aperture inside the proton blocking aperture, providing a ring contact. The top contacts 4, 5 may be, for example, gold with 2% beryllium added or a layered structure of titanium/platinum/gold, preferably deposited by electron beam evaporation. In an exemplary embodiment, current flows from the top ring contact down through the current funnel, into the active region where it recombines with opposite conductivity type carriers flowing up from the bottom contact. The recombination in the active region is a composite of spontaneous and stimulated emission, the stimulated emission exiting the device out the top surface via the aperture in the top ohmic contact One of skill in the art will appreciate that there are a plurality of suitable VCSEL structures which may be used to practice the present invention. Therefore the disclosed VCSEL structure is by way of example only and not by way of limitation.

Figure 4A:
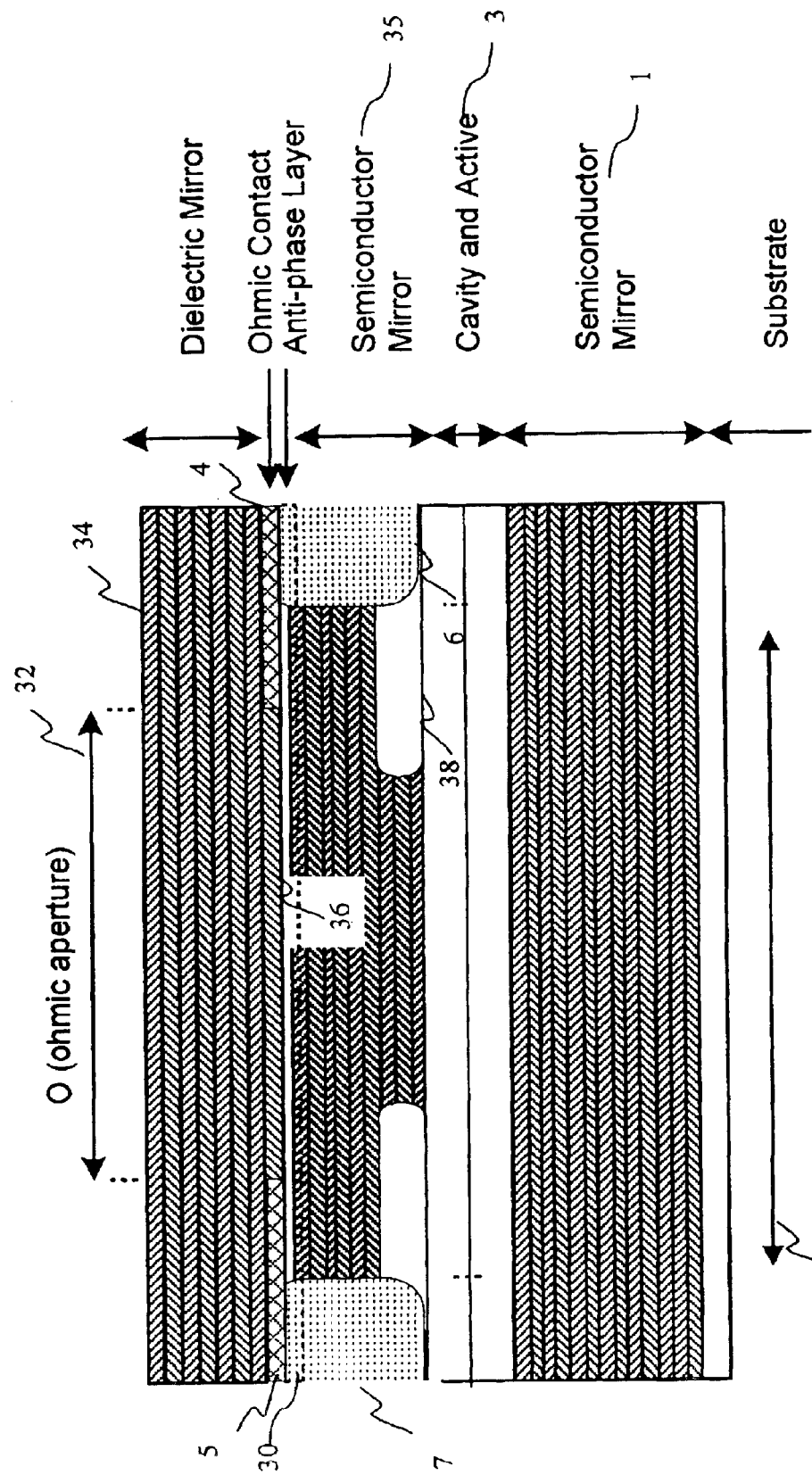
FIG. 4A is a cross-sectional view of an exemplary VCSEL structure having a hybrid semiconductor-dielectric mirror in accordance with the present invention.
Figure 4B:
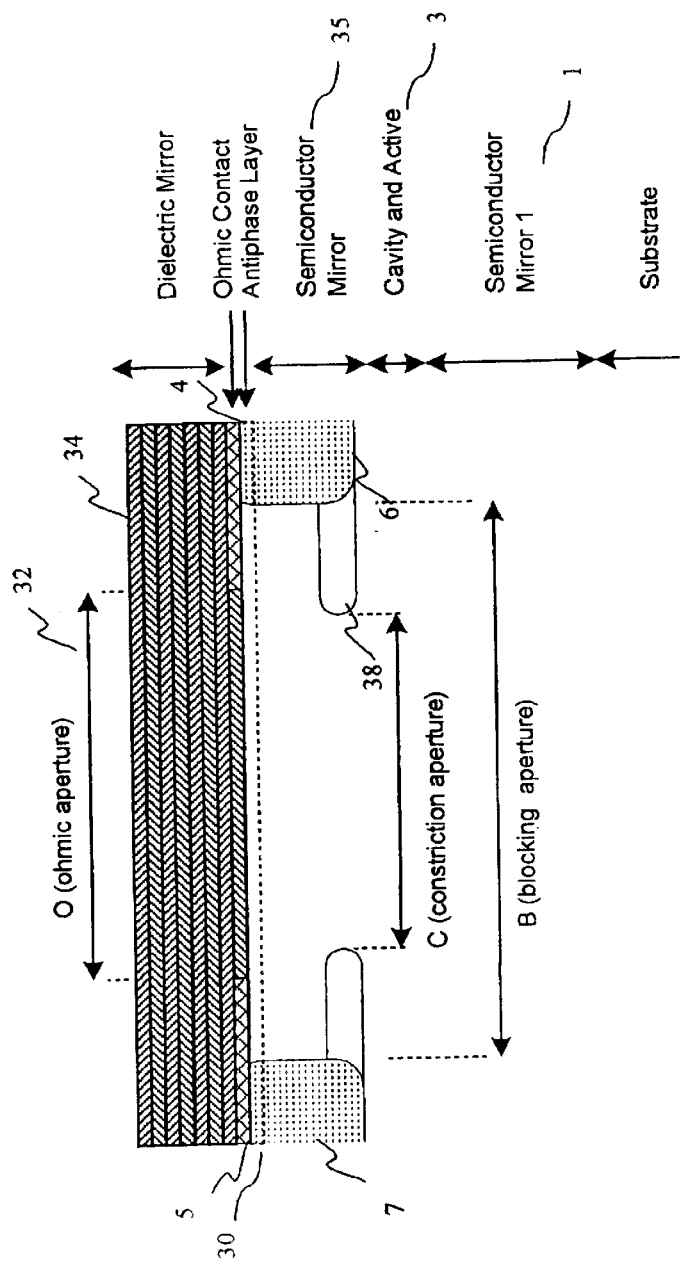
FIG. 4B is a cross-sectional view of an exemplary VCSEL structure of FIG. 4 wherein the layers have been removed for clarity in accordance with the present invention.

Referring to the cross-sectional view of FIG. 4A, an exemplary embodiment of the present invention includes a hybrid upper mirror having semiconductor mirror layers 35 and dielectric mirror layers 34. FIG. 4B is a cross-section of an exemplary embodiment shown in FIG. 4A wherein the layers have been removed for clarity. In an exemplary embodiment of the present invention a semiconductor anti-phase layer is integrated into the hybrid semiconductor-dielectric mirror on the uppermost layer of the semiconductor mirror 35. In an exemplary embodiment, an ohmic contact 4,5 is then formed on the anti-phase layer 30. The optical thickness of the anti-phase layer 30 is preferably chosen so that the reflection from the ohmic contact is out of phase with the second semiconductor mirror. This feature suppresses lasing underneath the ohmic contact while allowing standard ohmic contact materials such as gold or gold-beryllium alloys to be used. In addition, if ohmic aperture 32 is kept reasonably small, on the order of about seven microns, the excessive loss at the perimeter substantially prevents lasing in the material under the ohmic contacts, thereby suppressing higher order modes and ensuring single-mode operation.

Lasing suppression results from the optical loss created by destructive interference between reflections off the ohmic contact 4, 5 and the semiconductor mirror layers 35 of the hybrid semiconductor-dielectric mirror. Both the ohmic contact and the semiconductor mirror layers are high reflectivity mirrors. Therefore, the bandwidth of the resonance may be relatively narrow, so that strict manufacturing tolerances may be required to realize the desired lasing suppression. However, an exemplary VCSEL embodiment in accordance with the present invention increases the resonant bandwidth of the optical loss by adjusting the reflectivity of the semiconductor mirror layers 35 portion of the hybrid semiconductor dielectric mirror. In practice, the number of layers in the semiconductor mirror 35 are reduced as compared to a conventional VCSEL. In an exemplary VCSEL embodiment the dielectric mirror 34 portion of the hybrid semiconductor-dielectric mirror compensates for the reduced number of layers in the second semiconductor mirror 2. The hybrid semiconductor-dielectric mirror satisfies the standard overall VCSEL mirror reflectivity requirements known to those skilled in the art.

The dielectric mirror 34 portion of the hybrid mirror preferably comprises alternating one-quarter wavelength layers of silicon nitride and silicon dioxide or other suitable dielectric materials. The alternating layer of the dielectric mirror 34 may be patterned either by etching of liftoff processes known to those skilled in the art. In an exemplary VCSEL embodiment in accordance with the present invention, a first layer 36 of the dielectric mirror 34 is preferably not a multiple of one-quarter wavelength. Rather due thickness of the first dielectric mirror layer 36 is preferably adjusted to compensate for the semiconductor anti-phase layer, ensuring that the dielectric mirror 34 is in-phase with the semiconductor mirror. This first layer 36 shall hereinafter be referred to as a re-phase layer (36), as its function is to "re-phase" the effects of the anti-phase layer.

In operation, a semiconductor laser will not lase if the optical gain of the active region is less than the cavity optical losses. An exemplary embodiment of the present invention achieves mode suppression by increasing the optical loss for the undesired transverse modes thereby increasing the optical gain required for those modes to lase. The gain of the active region increases as the current injected into the laser is increased. However, when a mode achieves threshold, additional current is converted into light via stimulated emission rather than increasing the carrier density and optical gain. Thus the stimulated emission effectively clamps or limits the maximum carrier density and optical gain so that transverse modes with increased optical loss will not lase.

However, a phenomena known as spatial hole burning may increase the optical loss required to achieve mode suppression. Spatial hole burning generally occurs when the optical intensity profile does not match the injected current profile. The profile mismatch may increase the gain in regions where the lasing optical mode is weak. The regions with increased gain may cause transverse modes to switch on. Spatial hole burning is regularly observed in VCSELs as the bias current is increased. In addition, if the spatial overlap between modes is small, reduced carrier clamping may occur. Reduced carrier clamping has been observed in conventional VCSEL operation where transverse modes beneath the ohmic contacts that have marginal overlap with the fundamental mode have been seen to lase.

As is standard in the art the optical loss, L may be determined by adding the transmission T and the absorption A. T is the transmission out of the cavity, where the light is generated, to the output facet. A is the sum of all other losses and is calculated by A=1−T−R where R is the reflectivity back into the cavity. The reflection, transmission and losses may be calculated using a transmission matrix formalism as described in detail in Scott, J. W., "Design, Fabrication and Characterization of High-Speed Intra-Cavity Contacted Vertical-Cavity Lasers", University of California, Santa Barbara, Electrical and Computer Engineering Technical Report #95–06, June 1995, the contents of which are hereby incorporated by reference, or by any other suitable technique known in the art. The loss is calculated looking out of the cavity towards the top surface. The calculation can be made with either a dielectric, a gold metal or anti-phased gold metal to illustrate the effect.

An exemplary VCSEL designed for lasing operation at 0.845 μm includes a hybrid semiconductor-dielectric mirror having twelve semiconductor periods, a 0.42 $\lambda_s$ anti-phase layer, a 0.55 $\lambda_s$ dielectric re-phase layer and seven dielectric mirror periods. In an exemplary embodiment the semiconductor mirror periods comprise alternating 0.2 $\lambda_s$ thick layers of $Al_{0.25}Ga_{0.75}As$ and AlAs with graded transition regions as is known in the art. The dielectric mirror periods comprise alternating 0.25 $\lambda_s$ thick layers of $SiO2$ and $Si3N4$. Beneath the dielectric mirror period is a dielectric re-phase layer. The combination of semiconductor and dielectric mirrors enable the placement of the anti-phase metal reflection at the optimal location within the upper hybrid mirror.

Figure 5:
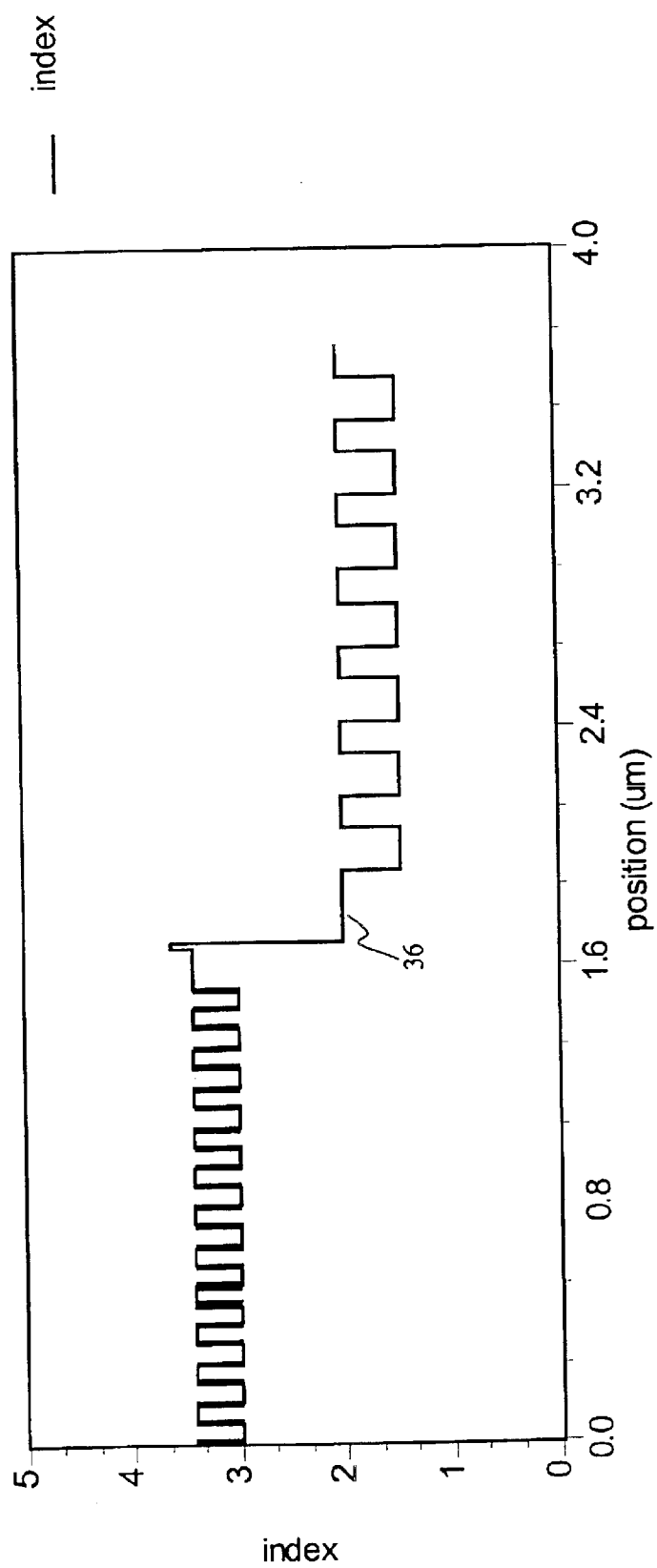
FIG. 5 graphically depicts the index of refraction of an exemplary VCSEL structure of FIG. 4 as a function of distance from the cavity in accordance with a preferred embodiment of the present invention.

FIG. 5 graphically depicts the index of refraction of an exemplary VCSEL as a function of axial distance from the cavity. The index of refraction alternates between 3 and 3.4 for the twelve semiconductor mirror periods, maintains the value of 3.4 for the anti-phase layer, increases to approximately 3.6 for the GaAs ohmic contact layer, decreases to a value of approximately 2 for the dielectric re-phase layer and alternates between a value of 1.45 and 2 for the dielectric mirror periods.

Figure 6:
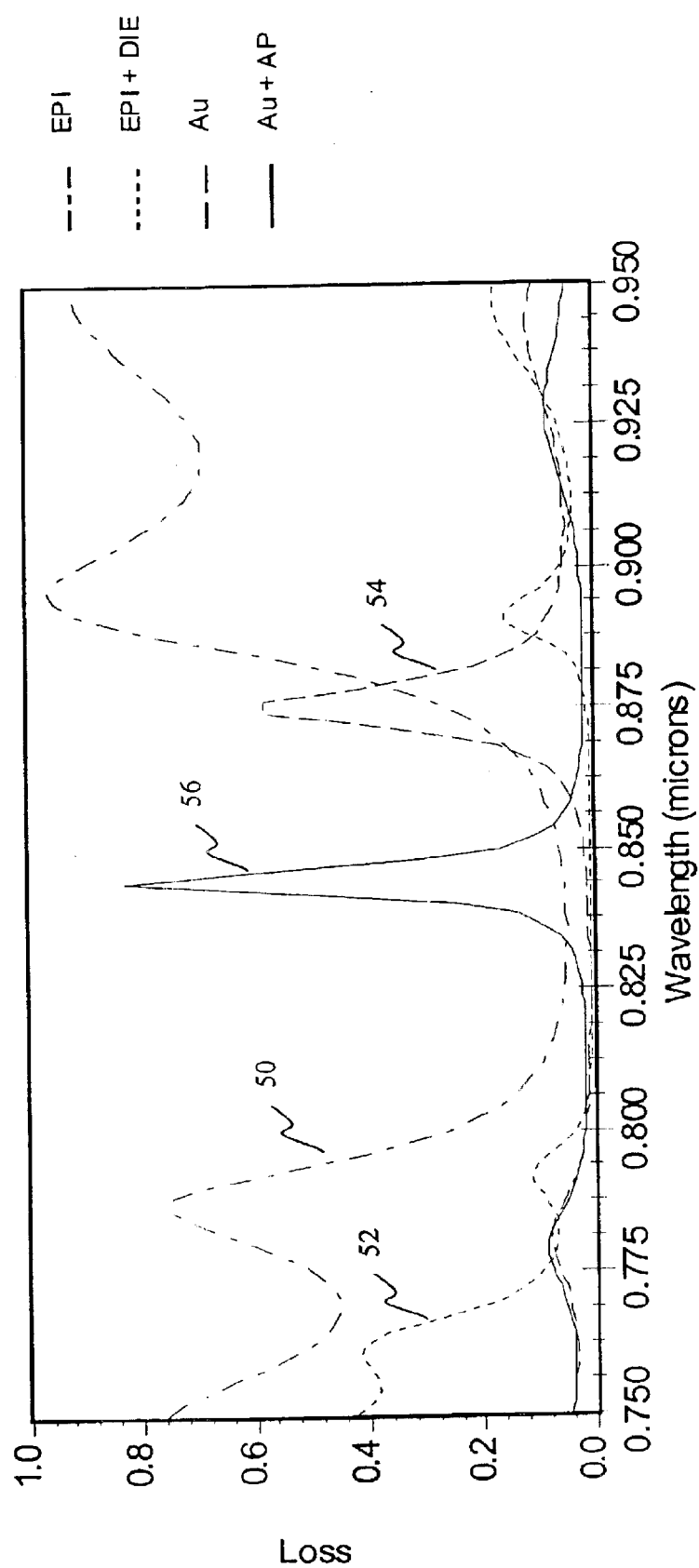
FIG. 6 graphically depicts the optical loss as seen from the cavity for various VCSEL structures in accordance with a preferred embodiment of the present invention.

FIG. 6 graphically depicts the optical loss as seen from the cavity for various configurations. The graph of "EPI" 50 shows the loss spectrum for the semiconductor mirror and anti-phase layer without the dielectric mirror portion of the hybrid mirror. The graph of "EPI+DIE" 52 shows a lower level of loss which results from the addition of the reflectivity of the dielectric mirror. This represents the top mirror losses of the lasing mode, on the order of 0.3% at the lasing wavelength, $\lambda_s$, of 0.845 μm. The graph of "Au" 54 shows the losses of the semiconductor mirror with a gold contact, without an anti-phase layer. In this case the losses are approximately 0.1%. The graph of "Au+AP" 56 depicts the loss of an exemplary embodiment including the gold contact, semiconductor mirror and the 0.42 $\lambda_s$ anti-phase layer. The losses at the anti-phase resonance for an exemplary embodiment are above 60% which is sufficient to prevent the material beneath the ohmic contact from achieving lasing.

Figure 7:
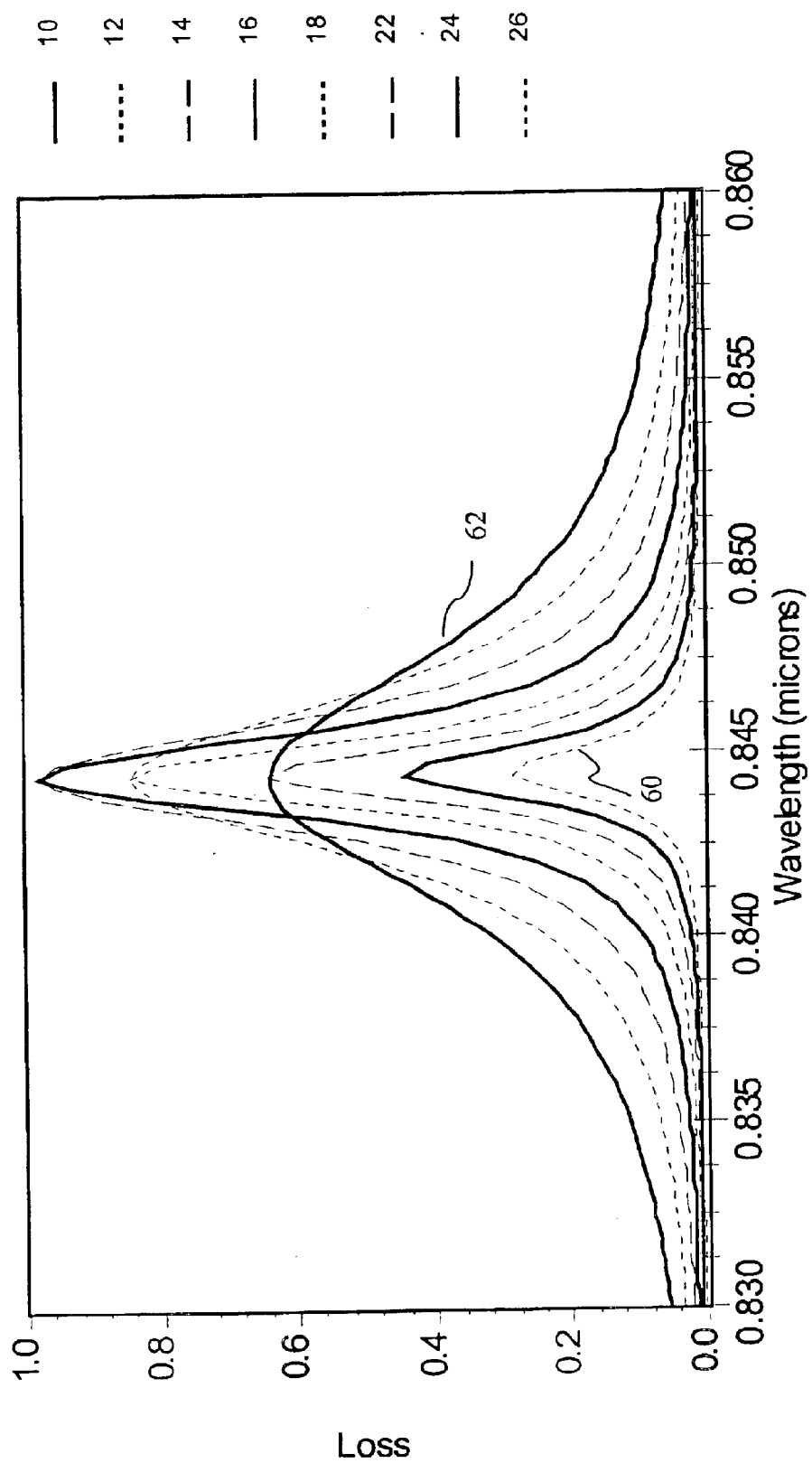
FIGS. 7 and 8 graphically depict the bandwidth of the optical loss of an exemplary VCSEL structure of FIG. 4 as a function of the number of semiconductor mirror periods in accordance with a preferred embodiment of the present invention.
Figure 8:
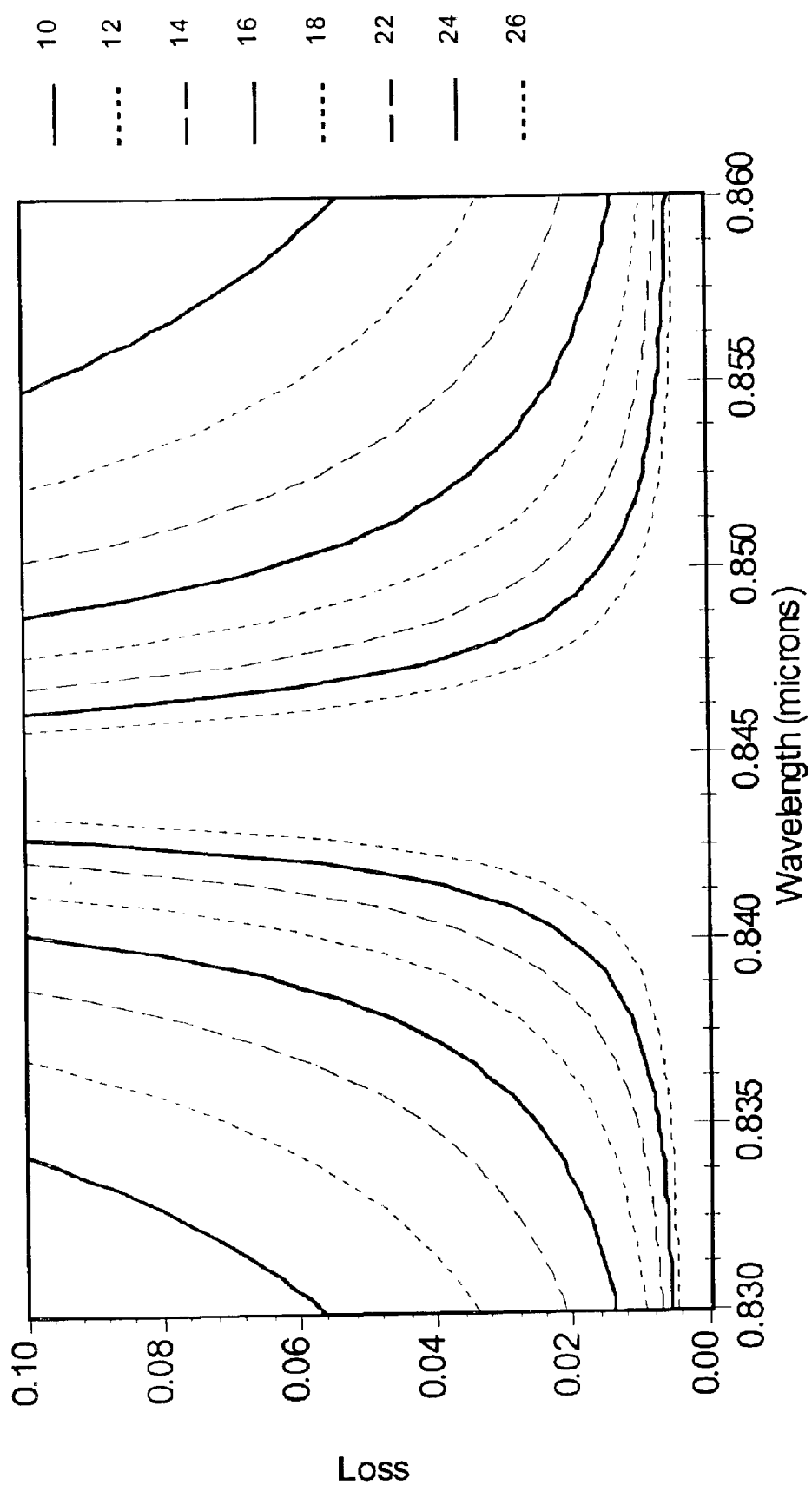

Robust mode suppression may be realized if the bandwidth of the optical loss is greater than the variations in wavelength and thickness of the various mirror layers that normally arise in the manufacturing process. FIGS. 7 and 8 graphically depict the bandwidth of the optical loss as a function of the number of semiconductor mirror periods.

The resonance shown in FIG. 7 is relatively narrow for the twenty six mirror period case 60, and then broadens as the number of mirror periods is reduced. At sixteen to fourteen periods the optical loss peaks. What is more important, however, is the bandwidth over which the loss exceeds the gain capability of the active material. The round trip material gain experienced by the optical field is given by $$G = \xi_{enh} g l_{act}$$

where G is the round trip gain, $\xi_{enh}$ is the standing wave enhancement factor, g is the material gain coefficient and $l_{act}$ is the total thickness of the active layer. Typically in a conventional VCSEL design there are three 60-angstrom quantum wells with a material gain on the order of about 1500 $cm^{-1}$ and an enhancement factor of 1.8. The corresponding round trip material gain is typically on the order of about 0.01 or 1%. If the optical loss significantly exceeds the material gain, lasing will be suppressed.

In addition, higher order modes whose intensity distributions are inherently more heavily weighted at the periphery of the laser cavity will also experience more loss and will be suppressed. A 2% loss limit is therefore used to estimate the bandwidth of the resonance as a function of semiconductor mirror periods in FIG. 8, which is a scaled version of FIG. 7. A VCSEL having a twenty six period semiconductor mirror portion of the upper hybrid mirror has a bandwidth of less than 8 nm. However, VCSEL designs which include a hybrid upper mirror having a semiconductor mirror portion with fourteen periods or less provide an optical loss of greater than 2% over a bandwidth of more than 30 nm. Thirty nanometers is 3.5% of the optical wavelength and well within the manufacturing tolerances of current VCSEL epitaxial growth.

The anti-phase layer is disposed on top of the second semiconductor mirror beneath the ohmic contact. The top surface will typically be made of two hundred angstroms or more of p-type GaAs or other chemically stable semiconductor that will form reliable ohmic contacts. The VCSEL mirror is typically designed for matching into a lower index, like air or glass, so that the high index of metal creates an opposite, 180° out of phase reflection. However, optical waves penetrate into metals, typically on the order of a few hundred angstroms. This penetration, known as the skin depth or phase penetration depth, provides an effective reflection deeper than the actual interface. The skin depth is preferably compensated for by either reducing the thickness of the anti-phase layer in accordance with the optical thickness of the skin depth or by adding an additional anti-phase layer that has a thickness equal to 0.5 $\lambda_s$ (or a multiple thereof) minus the phase shift created by the metal penetration.

The anti-phase layer thickness $l^{ap}$ in terms of wavelengths in the material is given by $$l_{ap} = (2 - \delta/\pi)(\lambda_s/4)$$

where $\lambda_s$ is the lasing wavelength thickness in the material and $\delta$ is the metal phase difference from $\pi$. The metal phase difference from $\pi$ be calculated by $$\delta = \tan^{-1}\left(\frac{2k_c n_s}{k_c^2 + n_c^2 - n_s^2}\right)$$

where the index of refraction of the metal ohmic contact is given by $n_c - jk_c$ and $n_s$ is the index of the semiconductor. The complex index of refraction for metals can be found in standard materials handbook. Using a value for gold of n=0.174 and $k_c$=5.7 gives a value for $\delta$=0.362 $\pi$ and a thickness $l_{ap}$=0.41 $\lambda_s$. From the theoretical starting point, a transmission matrix calculation should be used to optimize the design and center wavelengths as is standard in the art.

Referring to FIG. 4B, an exemplary embodiment of the present invention includes a reduced number of semiconductor mirror periods to increase the bandwidth of the optical loss so as to provide a robust mode control design. To compensate for the reduced reflectivity of the upper mirror, the preferred embodiment includes dielectric mirror layers 34 which provide the desired reflectivity and corresponding low optical losses in the lasing region. The dielectric mirrors may be fabricated with alternating quarter wavelength layers of silicon nitride (a high index material) and silicon dioxide (a relatively low index material) or other dielectric materials, patterned either by etching or liftoff as appropriate.

As shown in FIG. 5, a re-phase layer 36 of the high-index material is preferably deposited upon the anti-phase layer, followed by low-high index pairs to correctly phase the surface reflection at the dielectric-to-air boundary. The high-index, silicon nitride has an index of approximately two while the low-index silicon dioxide material has an index of approximately 1.45. The dielectric re-phase layer preferably compensates for the reflectivity of the semiconductor anti-phase layer to provide the proper phase between the dielectric mirror and the second semiconductor mirror. The thickness of re-phase layer 36 is preferably slightly more than one-half wavelength, so that the sum of the re-phase layer and the anti-phase layer is an integral number of half wavelengths. If the anti-phase layer is 0.41 $\lambda_s$ as in the previous example, then the re-phase layer would be either 0.09 $\lambda_s$ or 0.59 $\lambda_s$. In addition, tuning layers to control the slope efficiency may be deposited on the surface or within the dielectric as disclosed in U.S. Provisional Patent Application No. 60/125,916 filed Mar. 24, 1999. The contents of the preceding application is hereby incorporated by reference.

As previously described, to ensure single-mode operation the optical losses of the higher order modes preferably exceed the gain capabilities of the active material. However, the optical losses of the fundamental mode are preferably minimized to ensure lasing at the fundamental mode. A calculation of the optical intensity profile of the optical modes for a cylindrical step index or graded index profile is given in Chapter 3 of "Optical Electronics, $3^{rd}$ Edition" by Anon Yariv, Holt Rinehart and Winston, New York, 1985. In addition the radial intensity of the fundamental has also been previously described. For example, the radial intensity profile of the fundamental mode, HE11, and two higher order modes HE21 and HE12 is graphically depicted in FIG. 1a. The differentiation between modes is greatest at the periphery. Therefore, the application of a spacial varying optical loss, with largely a step function like profile at the periphery, provides the highest modal discrimination.

Referring to FIG. 4B, the anti-phase ohmic disclosed herein provides the step function like variation in optical loss shown in FIG. 1b. In addition, the use of the anti-phased ohmic contacts 4,5 integrated at the optimal depth in the upper mirror 2 preferably introduces mode selective loss which may be realized and maintained with standard manufacturing processes. In order to use the technique effectively, the loss should be applied at the edge of the optical intensity to minimize the optical loss at the fundamental mode. However, to function properly a transverse waveguide should consistently ensure the proper overlap of the modes with the loss. The transverse or radial optical mode's intensity profile is determined by radial index variations in the cavity. Transverse optical modes are typically characterized by the radius $\omega_0$ at which the optical intensity has dropped to $(1/e)^2$ or on the order of about 0.135 times the intensity at the center. The beam diameter $2\omega_0$ also known as the beam waist may be characterized as a function of the change in cavity wavelength or equivalently the change in lateral index. Typically, as the change in cavity wavelength, $\Delta\lambda_c$ becomes less than 1 nm, or approximately 0.1% of $\lambda_c$, the beam diameter increases rapidly. Therefore a beam waste that significantly exceeds the diameter of the index step may be realized by introducing small index variations.

As is known in the art, a lateral index guide may be formed using oxidation layers or by operation wherein joule heating, created from current injection, creates a positive change in index with temperature gradients thereby forming a thermal lens. Both techniques can provide for lateral index guiding. The realization of a VCSEL with optimized single mode performance may be determined by fabricating a series of VCSELs which vary the diameter of the ohmic aperture 32, so as to optimize the overlap of the anti-phase loss with the modal profile as shown in FIG. 1c.

Figure 9:
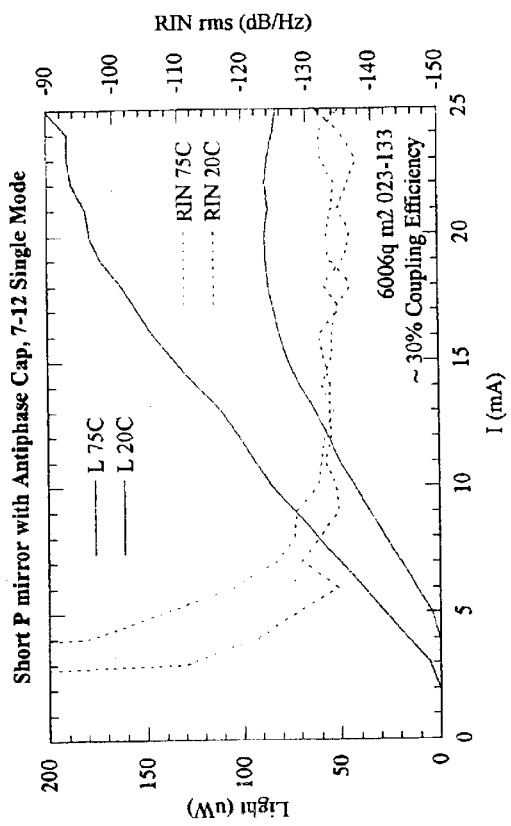
FIG. 9 graphically displays the fiber coupled current-to-light characteristics of an exemplary VCSEL having an anti-phased ohmic and a dielectric mirror structure in accordance with a preferred embodiment of the present invention.

FIG. 9 graphically displays the fiber coupled current-to-light characteristics of an exemplary VCSEL having an anti-phased ohmic and a dielectric mirror structure. The anti-phased ohmic aperture 32 is on the order of about seven microns, the blocking aperture 39 is on the order of about twelve microns (see FIG. 4B) and no constriction aperture or oxidation layer was used. The fiber coupling ratio for the representative measure system was on the order of about 30%. The laser's maximum output power at 75° C. is on the order of about 260 μW. At 20° C. the maximum laser output power increases to over 660 μW. Also, graphically displayed is the relative intensity noise (RIN) measured for 75° C. and 20° C. with a 2 GHz bandwidth detector. The RIN is low as expected for single-mode lasers.

Figure 10:
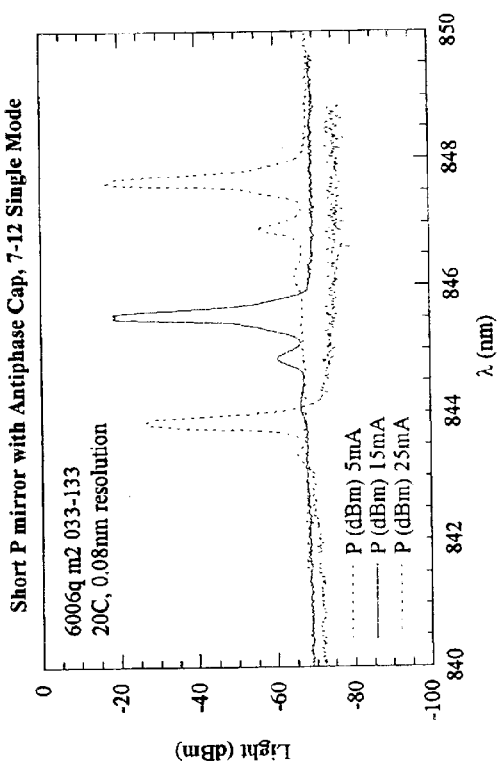
FIG. 10 graphically depicts the modal spectrum for an exemplary VCSEL in accordance with a preferred embodiment of the present invention.

FIG. 10 graphically depicts the modal spectrum, showing single-mode operation over the entire current-to-light characteristic for the VCSEL having an ohmic aperture of about seven microns and a blocking aperture of about twelve microns. The spectral characteristics at just above threshold, the maximum power output and just before complete rollover are displayed for a substrate temperature of 20° C. In each case, the side mode suppression ratio is greater than about 40 dB. The shift in wavelength with increasing bias current is due to index changes resulting from rises in the junction temperature. The smooth current to light characteristics and high side mode suppression throughout the laser characteristics demonstrates the effectiveness and manufacturability of this invention.

While thermal lenses and oxide apertures are well known in the art for providing index guides, index guiding may also be introduced by spatially varying the phase of part of the upper mirror. However, controlled spatial variation of the thickness within the midst of a semiconductor mirror is difficult to realize due to the single crystal nature of semiconductor growth. Therefore, an exemplary VCSEL utilizes a hybrid semiconductor-dielectric mirror wherein the thickness of a dielectric spacer is spatially varied. As disclosed below this introduces an index guide which controls the modal overlap of the optical modes with the anti-phase loss.

Figure 11:
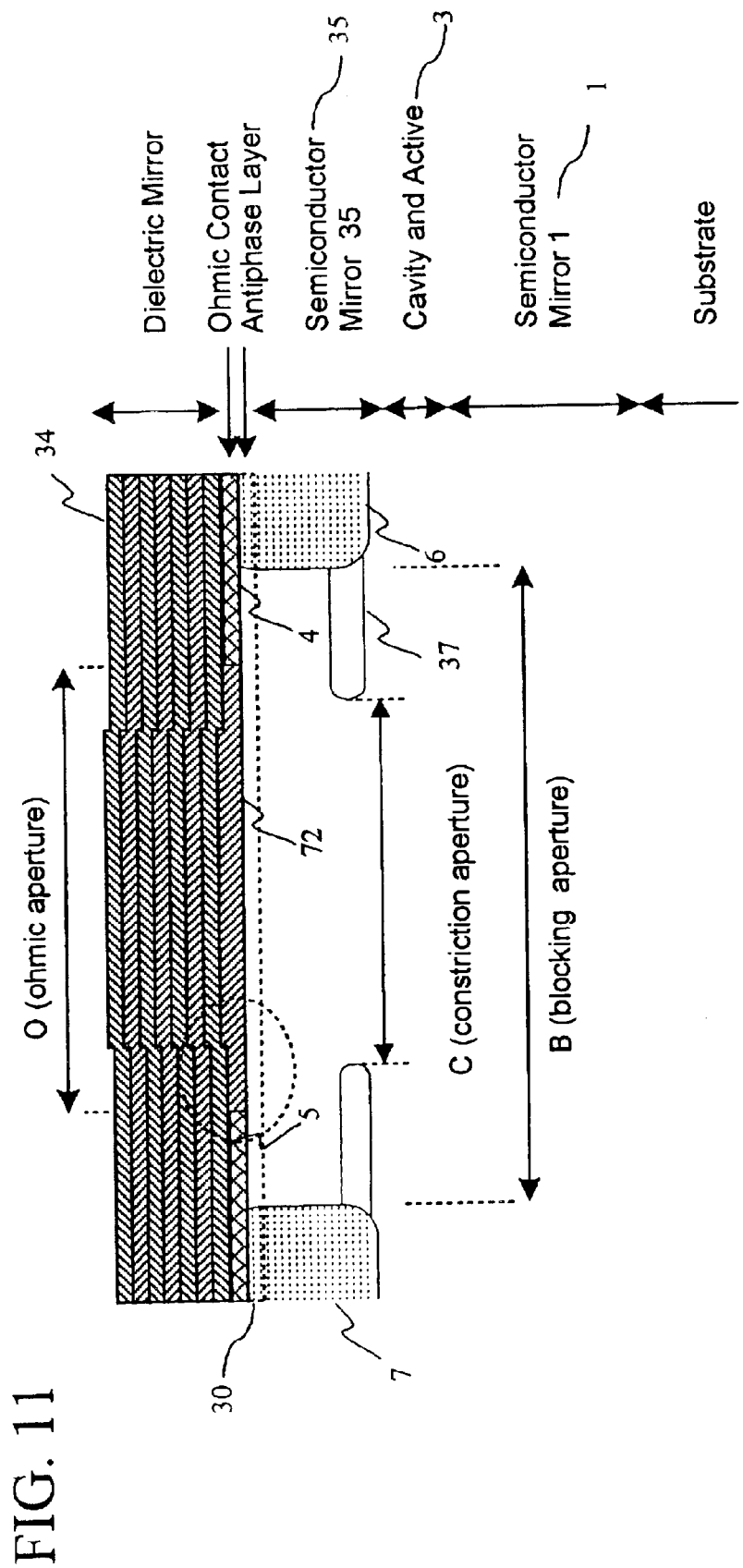
FIG. 11 is a cross-sectional view of an exemplary VCSEL structure having a hybrid semiconductor-dielectric mirror wherein the thickness of the dielectric spacer layer is spatially varied to control the modal overlap in accordance with a preferred embodiment of the present invention.

As shown in FIG. 11, an alternate single mode VCSEL structure designed to control the modal overlap includes a hybrid semiconductor dielectric mirror wherein the thickness of the dielectric re-phase layer is spatially varied. The thickness of the dielectric re-phase layer 72 is preferably varied on a sub-quarter wavelength basis to modify the resonant cavity wavelength $\lambda_c$. Lateral variation in the cavity wavelength in the axial direction results in an effective transverse index step. A shift in the resonant cavity wavelength may be used for singe-mode index guiding. Index guiding of this form may be characterized by separating the wave equation into longitudinal and transverse solutions. The resulting transverse index change Δn is given by:

$$\frac{\Delta n}{n_{\mathit{eff}}} = \frac{\Delta \lambda}{\lambda_c}$$

where $n_{\mathit{eff}}$ is the effective (longitudinal mode weighted) index and $\lambda_c$ is the resonant cavity wavelength. Shifts in cavity resonance on the order of about 1–4 nm may result in transverse index guiding for an 0.850 μm VCSEL.

Figure 12:
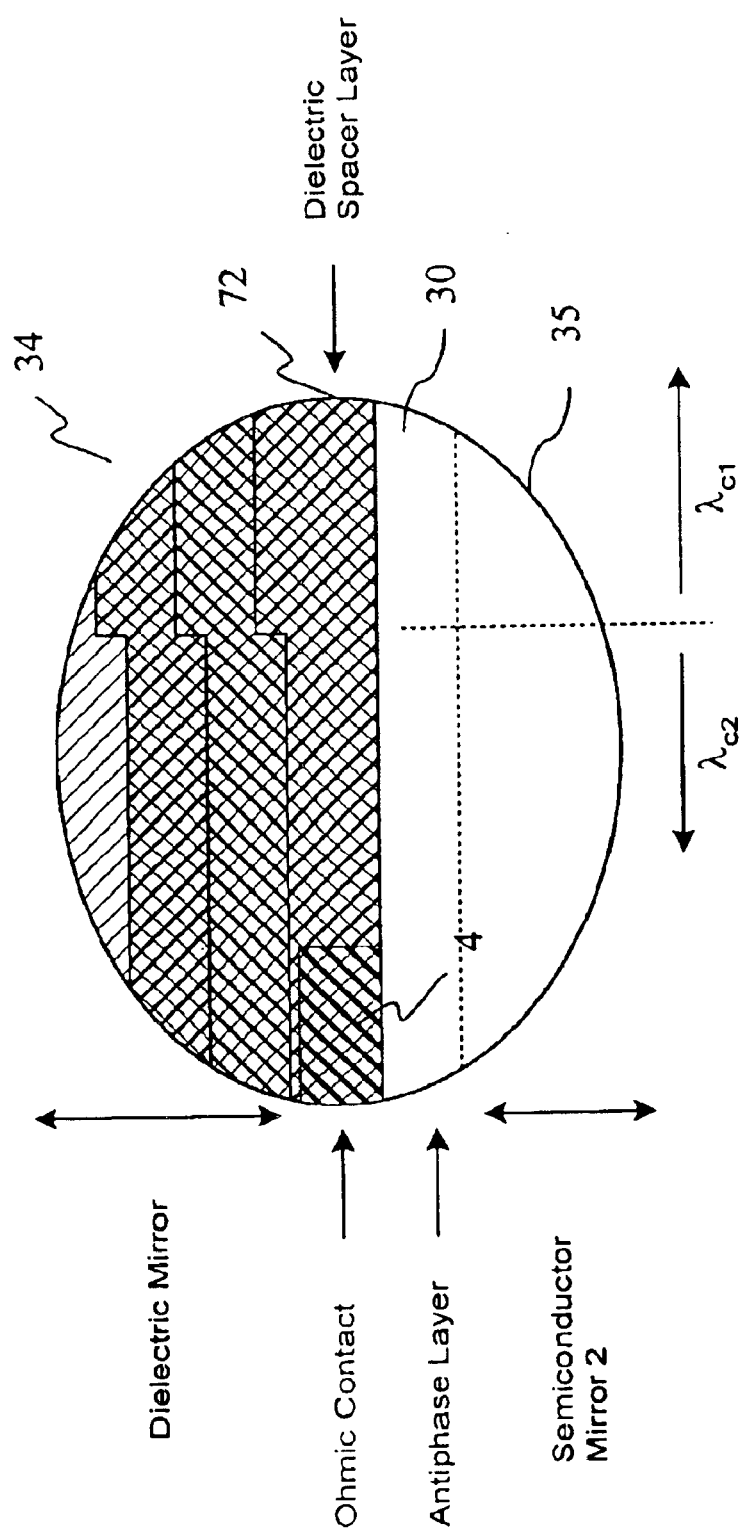
FIG. 12 is a cross-sectional view of the varying thickness dielectric spacer layer of FIG. 11 which shifts the resonant cavity wavelength $\lambda_c$ in accordance with a preferred embodiment of the present invention.

FIG. 12 is an expanded cross-sectional view of the dielectric re-phase layer 72 with varying lateral thickness shown in the cross-section of FIG. 11. The shift in cavity wavelength, $\Delta\lambda=\lambda_{c1}-\lambda_{c2}$, may be realized by forming a step in the thickness of the dielectric re-phase layer 72. The step in the thickness of the dielectric re-phase layer may be created by depositing part of the dielectric re-phase layer, patterned either by liftoff or plasma etching, and then depositing the remainder of the dielectric re-phase layer and ¼ $\lambda_s$ mirror stack over the entire VCSEL cavity surface. The incorporation of the dielectric re-phase layer with varying lateral thickness results in an index guide. Proper design of the index step creates a beam waist that significantly exceeds the diameter of the index guide, enabling control of the modal overlap with the anti-phase loss.

In addition, the hybrid semiconductor-dielectric mirror may be selectively etched in a highly controlled manner. Also, the hybrid semiconductor-dielectric mirror may be fabricated with proven manufacturing techniques such as for example, photolithography and liftoff techniques for patterning dielectric layers. In a preferred embodiment, the dielectric spacer layer is formed of silicon nitride. The mirror pairs above are formed by alternating depositions of ¼ $\lambda_s$ silicon dioxide and ¼ $\lambda_s$ silicon nitride, where the total combination of dielectric and semiconductor mirrors satisfy the VCSEL requirements for reflectivity as is known in the art. The dielectric mirrors may be formed by a variety of known techniques, such as for example, by patterned liftoff of appropriate combinations of zinc selenide, cadmium fluoride, titanium oxide or silicon dioxide as is known in the art.

Operation of an exemplary single mode VCSEL with modal overlap control may be demonstrated by a series of calculations. A representative VCSEL structure having a twenty nine period first semiconductor mirror, a one $\lambda_s$ thick cavity, and a second hybrid mirror, wherein the second hybrid mirror is preferably formed from a combination of semiconductor and dielectric mirrors. The semiconductor mirror in an exemplary VCSEL in accordance with the present invention comprise AlAs and $Al_{0.25}Ga_{0.75}As$ with compositional grades as is standard in the art. The surface of the second semiconductor mirror preferably includes an anti-phase layer, while the thickness of the dielectric spacer layer, as shown in FIG. 12, is varied to shift the resonant cavity wavelength $\lambda_c$. As summarized in Table 1, the number of semiconductor and dielectric mirror periods may be adjusted to maintain the same total reflectivity. While all of these structures have approximately the same overall mirror performance, the partitioning between semiconductor and dielectric mirror periods have changed. The anti-phase and dielectric spacer layer thicknesses are specified in terms of the lasing wavelength in the material, $\lambda_s$. As the number of dielectric periods increases the transmission increases and the losses decrease slightly due to reduced free carrier absorption in the semiconductor materials. Structure D is the mirror design shown in FIGS. 5 and 6.

TABLE 1

Spatially Varying Upper Mirror Structure

| Structure | Semi Periods | Dielectric Periods | Anti-phase | Spacer | Reflectivity | Transmission | Loss |
| --- | --- | --- | --- | --- | --- | --- | --- |
| A | 27 | 1 | 0.42 | 0.58 | 99.694% | 0.042% | 0.305% |
| B | 22 | 3 | 0.42 | 0.58 | 99.691% | 0.046% | 0.308% |

TABLE 1-continued

Spatially Varying Upper Mirror Structure

| Structure | Semi Periods | Dielectric Periods | Anti-phase | Spacer | Reflectivity | Transmission | Loss |
|---|---|---|---|---|---|---|---|
| C | 17 | 5 | 0.42 | 0.58 | 99.690% | 0.051% | 0.309% |
| D | 12 | 7 | 0.42 | 0.58 | 99.697% | 0.055% | 0.303% |
| E | 7 | 9 | 0.42 | 0.58 | 99.730% | 0.060% | 0.269% |

Figure 13:
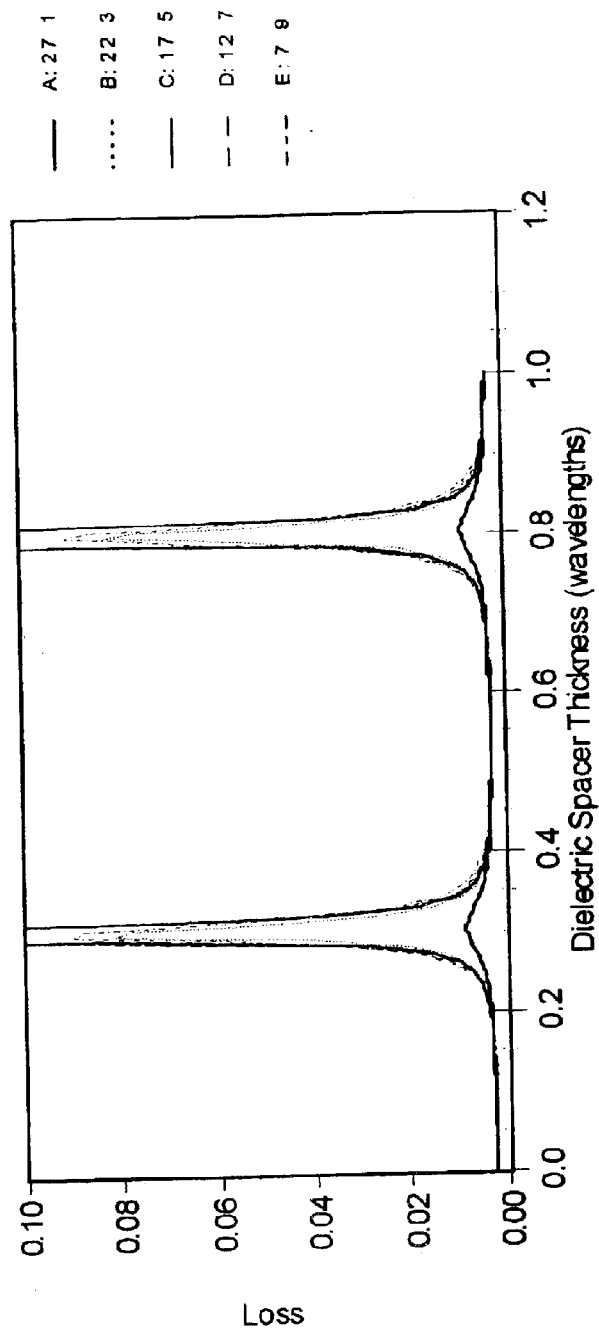
FIG. 13 graphically depicts a calculation of the optical loss of an exemplary VCSEL structure as a function of the dielectric spacer thickness in accordance with a preferred embodiment of the present invention.

FIG. 13 graphically depicts a calculation of the optical loss as a function of the dielectric spacer thickness. The inclusion of the semiconductor anti-phase layer, at a thickness of 0.42 $\lambda_s$ for these calculations shifts the resonances for the dielectric spacer layer from the nominal ¼ $\lambda_s$ and ¾ $\lambda_s$ thicknesses. A VCSEL structure, in accordance with the present invention utilizes the regions of low optical loss to shift the cavity wavelength and induce a lateral index guide. For this representative design and VCSEL structure, a thickness for the dielectric spacer layer in the range of about 0.36 to 0.76 $\lambda_s$ introduces little additional losses at the lasing wavelength $\lambda_s$.

Figure 14:
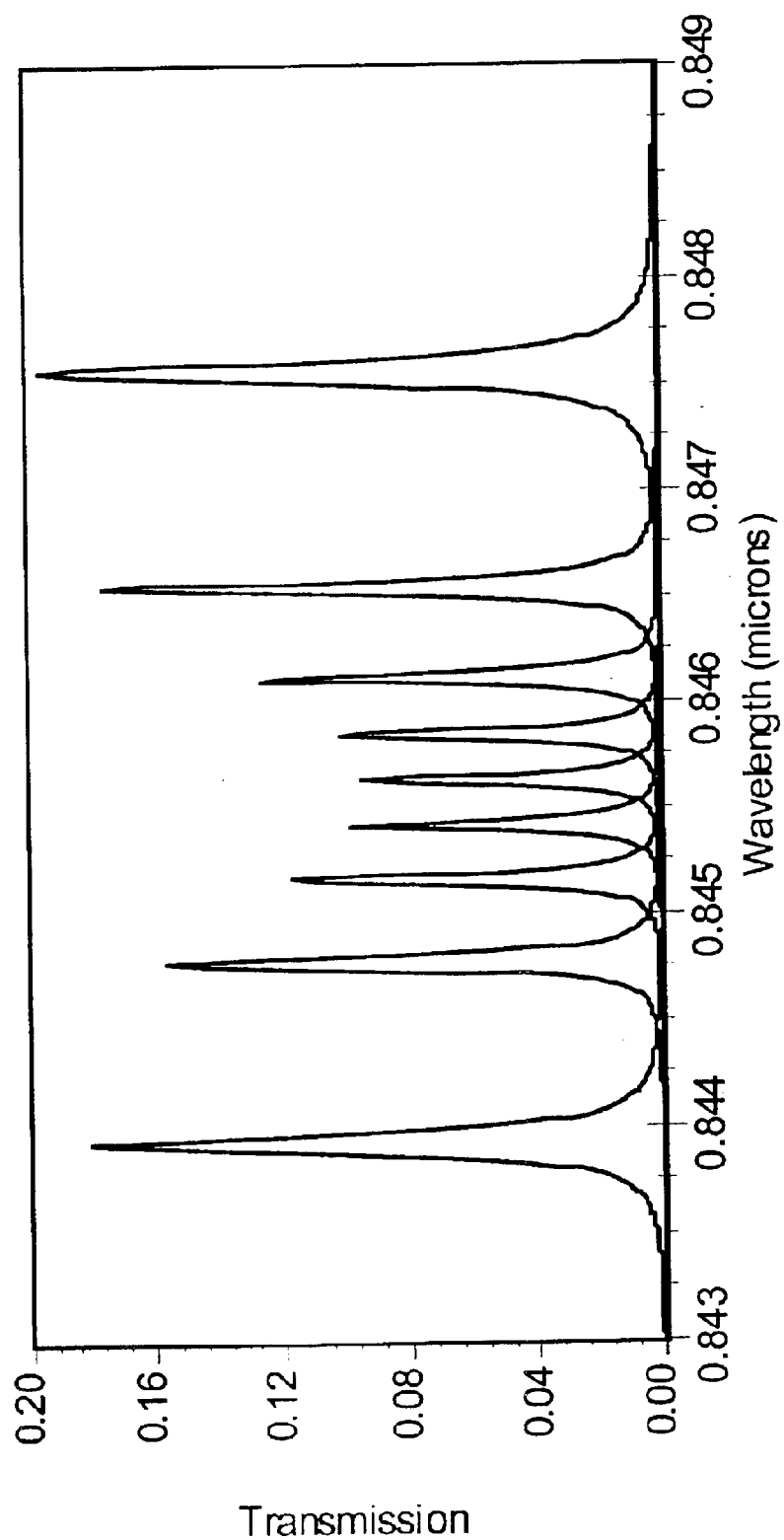
FIG. 14 graphically depicts the calculated transmission spectrum of an exemplary VCSEL structure for varying thickness of the dielectric spacer layer in accordance with a preferred embodiment of the present invention.

In accordance with the present invention the cavity wavelength may be determined from the resonance in the calculated transmission spectrum. FIG. 14 graphically depicts the calculated transmission spectrum for the representative VCSEL structure (using the top mirror of structure D of Table 1), for varying thickness of the dielectric spacer layer. The Fabry-Perot resonance indicates the cavity wavelength $\lambda_c$. The thickness of the dielectric spacer layer is uniformly stepped at 0.05 $\lambda_s$ across the low-loss regime of 0.36 $\lambda_s$ to 0.76 $\lambda_s$. The thickness of the anti-phase layer is held constant at 0.42 $\lambda_s$ for the calculated transmission spectrum of FIG. 14. Although the relationship is non-linear, a range of 4 nm is achieved. In the plot, thinner thicknesses for the dielectric spacer layer correspond to shorter cavity wavelengths. Therefore, a simple dielectric patterning process on the semiconductor surface beneath a dielectric mirror may be used to create a lateral index guide.

The level of index guiding which may be achieved via tuning of the resonant cavity wavelength through variation of the thickness of the dielectric spacer layer depends upon the VCSEL structure in use. Generally, the closer the spacer layer is to the cavity, the stronger the effect. The cavity wavelength for the minimum and maximum thicknesses of the dielectric spacer layer shown in FIG. 14 (0.36 $\lambda_s$ and 0.76 $\lambda_s$) are analyzed across a range of hybrid mirror structures in Table 2. Several orders of magnitude change in the index guiding effect are possible, depending on the structure used. Values on the order of one part per thousand are typical for single-mode waveguides. Higher values may be preferable to ensure stable mode patterns in the influence of thermal guiding effects. Therefore, rather than relying on single-mode waveguide conditions, the optical loss of the anti-phase ohmic contact is used to suppress higher-order modes. It has therefore been shown that by simple patterning of dielectrics within the midst of a hybrid mirror provides a simple and well controlled method for introducing a lateral index guide.

TABLE 2

| Structure | Semi | Dielectric | Anti-phase | λc, 0.36λs | λc, 0.76λs | Δλ/λc |
|---|---|---|---|---|---|---|
| A | 27 | 1 | 0.42 | 0.84590 | 0.84593 | 3.5E-5 |
| B | 22 | 3 | 0.42 | 0.84582 | 0.84608 | 3.1E-4 |
| C | 17 | 5 | 0.42 | 0.84540 | 0.84640 | 1.2E-3 |
| D | 12 | 7 | 0.42 | 0.84390 | 0.84755 | 4.3E-3 |
| E | 7 | 9 | 0.42 | 0.83925 | 0.85125 | 1.4E-2 |

For high-speed applications the non-lasing material beneath the ohmic contact 4, 5 should not be pumped. Therefore, an exemplary VCSEL for single mode operation preferably includes a current constriction 38. The current constriction 38 preferably forms an encircling high resistance region. The diameter of the current constriction 38 is preferably different than the diameter of the current confinement region formed by the blocking implantation regions 6, 7. The current constriction 38 may be formed by proton ion implantation or selective oxidation of a high aluminum layer located near an axial standing wave null. The current constriction inhibits current injection into the non-lasing material to prevent the diffusion of carriers from the non-lasing regions of the active layer into the lasing regions. In addition, the current constriction preferably provides reduced overall threshold current and provides faster optical rise and fall times. In one embodiment, the constriction realized by ion implantation may be placed into the active region reducing the carrier lifetime and thereby minimizing diffusion effects.

Referring back to FIG. 4B, an exemplary single mode VCSEL preferably includes a current constriction aperture 41 in the buried current blocking layer 37. The current constriction aperture 41 preferably restricts the current from being injected into the non-lasing material beneath the ohmic contacts 4,5. Without the current constriction aperture 41, the active material under the ohmic contacts 4,5 may be charged to high carrier densities because there is no stimulated-emission-enhanced recombination. When the current is modulated the charge under the ohmic contacts 4,5 may diffuse into the lasing mode with a time constant independent of the data rate, typically on the order of 1 ns. A current constriction aperture is therefore preferred for VCSEL operations that require modulating the laser at high speeds.

The current constriction layers 37 may be formed using oxidation layers placed near standing wave nulls or using an ion-implantation technique as is well known to those skilled in the art. An ion implanted current constriction layer 37 is preferably formed by the implantation of hydrogen ions at a dose on the order of $5 \times 10^{14}$ cm$^{-2}$, followed by a short rapid thermal anneal at 550° C. to 600° C. The energy may be calculated using the IBM® program SRIM 2000® whose theory is given in "*The Stopping and Range of Ions in Solids*", by J. F. Ziegler, J. P. Biersack and U. Littmark, Pergamon Press, New York, 1999.

The diameter of the current constriction aperture 41 is preferably close to the diameter of the ohmic aperture 32. The current constriction layers 37 are preferably formed on one or both sides of the active region, depending on the technique used to form the layers. An exemplary embodiment constricts on the p-type material side. Generally current constriction on the p-type material side of the active layer is preferable in that holes have a lower diffusion coefficient as compared to electrons. However, because variations in current spreading may result from the exact doping profile of the mirror layers, the depth and aperture diameter of the constriction layer 37 is preferably determined from a series of simple experiments as follows. Constriction dimensions to be optimized are within the range of the ohmic aperture ±5 mm, accounting for current spreading and lateral carrier diffusion in the active region. Single-mode structures should be fabricated with varying constriction diameters and their high-speed properties characterized to determine the optimal design that minimizes rise and fall time and other pattern dependent phenomena.

Although a preferred embodiment of the present invention has been described, it should not be construed to limit the scope of the appended claims. For example, the high loss of an anti-phase metal placed on the semiconductor surface may be realized by including a metal, such as for example Titanium, within the dielectric spacer above the semiconductor surface. In this case the same phase matching conditions between the metal layer and upper semiconductor mirror layers apply except that the semiconductor is properly phased for low index material such as air or dielectrics. A dielectric spacer, in accordance with the present invention, is partially deposited upon the upper semiconductor mirror layers. Next an annular deposit of the metal layer is deposited to create a ring of loss. The remaining dielectric spacer and mirrors are then deposited. The metal layer is preferably a refractory metal such as Titanium or Chromium to ensure adequate bonding with dielectric materials. The metal layer may be deposited using a variety of techniques known in the art, such as e-beam evaporation or sputtering, although e-beam is well suited to liftoff patterning.

Those skilled in the art will understand that various modifications may be made to the described embodiment. For example, while a preferred method of index guiding was demonstrated using patterned dielectrics, it is also possible to create the same effect by patterned etching of the semiconductor surface. The variation in mirror thickness shown in FIG. 13 may be created in the upper semiconductor mirror layer, leaving a step up in the center of the VCSEL aperture. If an anti-phase ohmic contact were used, then the semiconductor surface would step back up under the ohmic. If an anti-phase metal buried in the dielectric were used, then the step down could be everywhere in the field. As FIG. 14 shows, the waveguide effect is sensitive to the exact depth of the step. Dielectric depositions are easy to control and highly selective etches relative to semiconductors exist. For semiconductor phase shifted waveguides, the etch would best be enabled using either an anodic etch for precise control or selective etching of different semiconductor layers, such as high and low Aluminum containing AlGaAs grown into the semiconductor. Moreover, to those skilled in the various arts, the invention itself herein will suggest solutions to other tasks and adaptations for other applications. In addition one of skill in the art will appreciate that the present invention is not limited to GaAs VCSELs. Rather the present invention is applicable for use with VCSELs whose wavelengths vary from ultraviolet to deep infrared. It is therefore desired that the present embodiments be considered in all respects as illustrative and not restrictive, reference being made to the appended claims rather than the foregoing description to indicate the scope of the invention.

What is claimed is:

1. A vertical cavity surface emitting laser comprising:
   a substrate;
   a first mirror formed adjacent to said substrate;
   an active region formed adjacent to said first mirror;
   a semiconductor mirror formed adjacent to said active region, said semiconductor mirror comprising a plurality of semiconductor mirror layers;
   an anti-phase layer formed on said semiconductor mirror;
   an annular reflector formed on said anti-phase layer wherein reflections from said reflector are substantially out of phase with reflections from said semiconductor mirror layers to provide mode selective optical loss in order to suppress higher order modes; and
   a re-phase layer formed on said anti-phase layer and within said annular reflector.

2. The vertical cavity surface emitting laser of claim 1 wherein a total thickness of said anti-phase layer and said re-phase layer is substantially an integer multiple of ½ wavelength.

3. The vertical cavity surface emitting laser of claim 2 further comprising:
   a dielectric mirror formed adjacent to said re-phase layer, said dielectric mirror comprising a plurality of dielectric mirror layers.

4. The vertical cavity surface emitting laser of claim 1 further comprising:
   a dielectric mirror formed adjacent to said re-phase layer, said dielectric mirror comprising a plurality of dielectric mirror layers.

5. The vertical cavity surface emitting laser of claim 1 wherein said anti-phase layer is formed from a semiconductor material.

6. The vertical cavity surface emitting laser of claim 1 wherein said re-phase layer is formed from a dielectric material.

7. The vertical cavity surface emitting laser of claim 1 wherein said anti-phase layer and said re-phase layer are planar.

8. A vertical cavity surface emitting laser comprising:
   a substrate;
   a first mirror formed adjacent to said substrate;
   an active region formed adjacent to said first mirror;
   a semiconductor mirror formed adjacent to said active region, said semiconductor mirror comprising a plurality of semiconductor mirror layers;
   an anti-phase layer formed on said semiconductor mirror, wherein said anti-phase layer is formed from a semiconductive material;
   an annular reflector formed on said anti-phase layer wherein reflections from said reflector are substantially out of phase with reflections from said semiconductor mirror layers to provide mode selective optical loss in order to suppress higher order modes.

9. A vertical cavity surface emitting laser comprising:
   a substrate;
   a first mirror formed adjacent to said substrate;
   an active region formed adjacent to said first mirror;
   a semiconductor mirror formed adjacent to said active region, said semiconductor mirror comprising a plurality of semiconductor mirror layers;

an anti-phase layer formed on said semiconductor mirror, wherein said anti-phase layer is planar;

an annular reflector formed on said anti-phase layer wherein reflections from said reflector are substantially out of phase with reflections from said semiconductor mirror layers to provide mode selective optical loss in order to suppress higher order modes.

10. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
an anti-phase layer formed on said semiconductor mirror;
an annular reflector formed on said anti-phase layer wherein reflections from said reflector are substantially out of phase with reflections from said semiconductor mirror layers to provide mode selective optical loss in order to suppress higher order modes,
said annular reflector comprising a step function mesa formed in the surface of said anti-phase layer.

11. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
an anti-phase layer formed on said semiconductor mirror;
an annular reflector formed on said anti-phase layer, said annular reflector defining an optical axis of said laser,
said anti-phase layer and said annular reflector cooperating to suppress higher order modes at a predetermined radial distance from said optical axis wherein reflections from said reflector are substantially out of phase with reflections from said semiconductor mirror layers to provide mode selective optical loss at said predetermined radial distance from said optical axis, while also allowing a fundamental mode to propagate along said optical axis; and
a re-phase layer formed on said anti-phase layer and within said annular reflector.

12. The vertical cavity sure emitting laser of claim 11 wherein a total thickness of said anti-phase layer and said re-phase layer is substantially an integer multiple of ½ wavelength.

13. The vertical cavity surface emitting laser of claim 12 further comprising:
a dielectric mirror formed adjacent to said re-phase layer, said dielectric mirror comprising a plurality of dielectric mirror layers.

14. The vertical cavity surface emitting laser of claim 11 further comprising:
a dielectric mirror formed adjacent to said re-phase layer, said dielectric mirror comprising a plurality of dielectric mirror layers.

15. The vertical cavity surface emitting laser of claim 11 wherein said anti-phase layer is formed from a semiconductor material.

16. The vertical cavity surface emitting laser of claim 11 wherein said re-phase layer is formed from a dielectric material.

17. The vertical cavity surface emitting laser of claim 11 wherein said anti-phase layer and said re-phase layer are planar.

18. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
an anti-phase layer formed on said semiconductor mirror, wherein said anti-phase layer is formed from a semiconductor material;
an annular reflector formed on said anti-phase layer, said annular reflector defining an optical axis of said laser,
said anti-phase layer and said annular reflector cooperating to suppress higher order modes at a predetermined radial distance from said optical axis wherein reflections from said reflector are substantially out of phase with reflections from said semiconductor mirror layers to provide mode selective optical loss at said predetermined radial distance from said optical axis, while also allowing a fundamental mode to propagate along said optical axis.

19. The vertical cavity surface emitting laser of claim 18 wherein said re-phase layer is formed from a dielectric material.

20. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
an anti-phase layer formed on said semiconductor mirror, wherein said anti-phase layer is planar;
an annular reflector formed on said anti-phase layer, said annular reflector defining an optical axis of said laser,
said anti-phase layer and said annular reflector cooperating to suppress higher order modes at a predetermined radial distance from said optical axis wherein reflections from said reflector are substantially out of phase with reflections from said semiconductor mirror layers to provide mode selective optical loss at said predetermined radial distance from said optical axis, while also allowing a fundamental mode to propagate along said optical axis.

21. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
an anti-phase layer formed on said semiconductor mirror;
an annular reflector formed on said anti-phase layer, said annular reflector defining an optical axis of said laser,
said annular reflector comprising a step function mesa formed in the surface of said anti-phase layer,
said anti-phase layer and said annular reflector cooperating to suppress higher order modes at a predetermined radial distance from said optical axis wherein reflections from said reflector are substantially out of phase with reflections from said semiconductor mirror layers to provide mode selective optical loss at said predetermined radial distance from said optical axis, while also allowing a fundamental mode to propagate along said optical axis.

22. A vertical cavity surface emitting laser comprising:
a substrate;
a first semiconductor mirror formed adjacent to said substrate;
an active region formed adjacent to said first semiconductor mirror;
a second semiconductor mirror formed adjacent to said active region, said second semiconductor mirror comprising a plurality of semiconductor mirror layers;
a planar semiconductor anti-phase layer formed on said semiconductor mirror, said anti-phase layer comprising a semiconductor mirror layer,
an annular ohmic contact formed on said anti-phase layer, said annular ohmic contact defining an optical axis of said laser and providing an annular reflective surface at a predetermined radial distance from said optical axis,
said anti-phase layer and said annular reflective surface cooperating to suppress higher order modes at a predetermined radial distance from said optical axis wherein reflections from said reflective surface are substantially out of phase with reflections from said semiconductor mirror layers to provide mode selective optical loss at said predetermined radial distance from said optical axis, while also allowing a fundamental mode to propagate along said optical axis;
a planar dielectric re-phase layer formed on said semiconductor anti-phase layer; and
a dielectric mirror formed on said dielectric phase layer, said dielectric mirror comprising a plurality of dielectric mirror layers, wherein said dielectric re-phase layer comprises a dielectric mirror layer and further wherein a total thickness of said anti-phase layer and said re-phase layer is substantially an integer multiple of ½ wavelength.

23. A vertical cavity surface emitting laser comprising:
a substrate;
a first mirror formed adjacent to said substrate;
an active region formed adjacent to said first mirror;
a semiconductor mirror formed adjacent to said active region, said semiconductor mirror comprising a plurality of semiconductor mirror layers;
a planar anti-phase layer formed on said semiconductor mirror;
an annular reflector formed on said anti-phase layer, said annular reflector defining an optical axis of said laser,
said anti-phase layer and said annular reflector cooperating to suppress higher order modes at a predetermined radial distance from said optical axis wherein reflections from said reflector are substantially out of phase with reflections from said semiconductor mirror layers to provide mode selective optical loss at said predetermined radial distance from said optical axis, while also allowing a fundamental mode to propagate along said optical axis; and
a planar re-phase layer formed on said anti-phase layer,
wherein a planar thickness of said anti-phase layer and said re-phase layer is spatially varied with a step function at a predetermined radial distance from said optical axis to introduce a lateral index guide.

24. The vertical cavity surface emitting laser of claim 23 wherein a total thickness of said anti-phase layer and said re-phase layer is substantially an integer multiple of ½ wavelength.

25. The vertical cavity surface emitting laser of claim 24 further comprising:
a dielectric mirror formed adjacent to said re-phase layer, said dielectric mirror comprising a plurality of dielectric mirror layers.

26. The vertical cavity surface emitting laser of claim 24 wherein said anti-phase layer is formed from a semiconductor material.

27. The vertical cavity surface emitting laser of claim 26 wherein said re-phase layer is formed from a dielectric material.

28. The vertical cavity surface emitting laser of claim 24 wherein said re-phase layer is formed from a dielectric material.

29. The vertical cavity surface emitting laser of claim 23 further comprising:
a dielectric mirror formed adjacent to said re-phase layer, said dielectric mirror comprising a plurality of dielectric mirror layers.

30. The vertical cavity surface emitting laser of claim 23 wherein said anti-phase layer is formed from a semiconductor material.

31. The vertical cavity surface emitting laser of claim 23 wherein said annular reflector comprises a conductive metallic material forming an ohmic contact.

* * * * *